United States Patent [19]

Lesk

[11] 4,027,053
[45] May 31, 1977

[54] METHOD OF PRODUCING POLYCRYSTALLINE SILICON RIBBON

[75] Inventor: Israel A. Lesk, Scottsdale, Ariz.

[73] Assignee: Motorola, Inc., Chicago, Ill.

[22] Filed: Dec. 19, 1975

[21] Appl. No.: 642,523

[52] U.S. Cl. .................................. 427/53; 427/55; 427/82; 427/86; 427/215; 427/255; 427/314; 423/348; 423/349; 423/350

[51] Int. Cl.² ..................... B05D 5/12; C01B 33/02

[58] Field of Search ............ 427/215, 82, 86, 255, 427/53, 55, 314; 423/348, 349, 350

[56] References Cited

UNITED STATES PATENTS

| | | | |
|---|---|---|---|
| 2,840,489 | 6/1958 | Kempter | 427/86 |
| 2,989,376 | 6/1961 | Schaefer | 423/349 |
| 2,999,735 | 9/1961 | Reuschel | 427/86 |
| 3,012,861 | 12/1961 | Ling | 427/86 |
| 3,012,862 | 12/1961 | Bertrand | 427/86 |
| 3,021,198 | 2/1962 | Rummel | 427/86 |
| 3,042,494 | 7/1962 | Gutsche | 427/86 |
| 3,900,597 | 8/1975 | Chruma | 427/255 |

Primary Examiner—Michael F. Esposito
Attorney, Agent, or Firm—Lowell E. Clark

[57] ABSTRACT

A method of producing a ribbon of polycrystalline silicon, which includes contacting a moving surface carrying a layer of particulate semiconductor silicon, with a gaseous silicon source, is disclosed. The gaseous silicon source permeates the layer of particulate silicon and, with heat applied, deposits silicon that knits the silicon particles together to a continuous, coherent polycrystalline ribbon. The ribbon is then separated from the moving surface for further processing, for example, conversion to monocrystalline silicon.

6 Claims, 3 Drawing Figures

METHOD OF PRODUCING POLYCRYSTALLINE SILICON RIBBON

RELATED APPLICATIONS

This application is related to pending application, U.S. Ser. No. 592,859, filed July 3, 1975, entitled, "Method of Producing Polycrystalline Silicon" and assigned to the assignee of the present invention.

BACKGROUND OF THE INVENTION

This invention relates to a method of producing polycrystalline semiconductor material, and, more particularly, to a method of producing polycrystalline ribbons of silicon.

Semiconductor devices are generally fabricated from wafers of monocrystalline slicon. Various procedures for preparing monocrystalline silicon wafers have been described in the prior art. Thus, the Czochralski method comprises pulling a monocrystalline rod from a pool of liquid produced by melting polycrystalline slicon. Another method, known as the float zone technique, comprises pulling a monocrystalline rod from a liquid region, formed by localized heating, within or on top of an ingot of polycrystalline material. Both techniques produce a monocrystalline rod which must be sawed into slices and further processed by lapping, polishing, and/or etching to produce wafers suitable for the production of semiconductor devices.

With the present need for new energy sources, many suggestions have revolved around the use of solar energy. One way of utilizing this type of energy is with solar cells, whereby radiant solar energy is converted directly to electrical energy. However, systems using solar cells will require large amounts of semiconductor material, that is, monocrystalline silicon. If such systems are to become commercially acceptable, such slicon must be attainable at a cost far less than present costs for monocrystalline silicon wafers.

In the aforementioned related application, a method of producing a polycrystalline silicon web has been disclosed. In accordance with that invention, a particulate layer of polycrystalline silicon in contact with a continuously moving belt is exposed to a heat source which melts its upper surface to form a coherent polycrystalline web. The web of polycrystalline semiconductor material thus obtained can then be converted into monocrystalline material, for example by contacting it with a monocrystalline semiconductor material seed and heating the interface therebetween as described in copending application U.S. Ser. No. 537,976, filed Jan. 2, 1975, entitled, "Silicon Manufacture" and assigned to the assignee of the present invention.

SUMMARY OF THE INVENTION

It is an object of this invention to provide an improved method for the manufacture of ribbons of polycrystalline semiconductor material.

It is a further object of the present invention to provide a ribbon of polycrystalline silicon of more controllable size than those made by prior methods.

In accordance with this invention there is provided a method of producing a ribbon of polycrystalline semiconductor material which comprises the steps of providing a moving surface having disposed thereon a layer of particulate semiconductor silicon, providing a gaseous silicon source contacting said gaseous source with said particulate semiconductor silicon at a temperature sufficient to deposit silicon from said source onto said silicon, thereby forming a continuous, coherent web of semiconductor material.

The method of this invention will be better understood by reference to the following description of the invention and the accompanying drawings

THE DRAWINGS

DETAILED DESCRIPTION OF THE INVENTION

Figure 1:
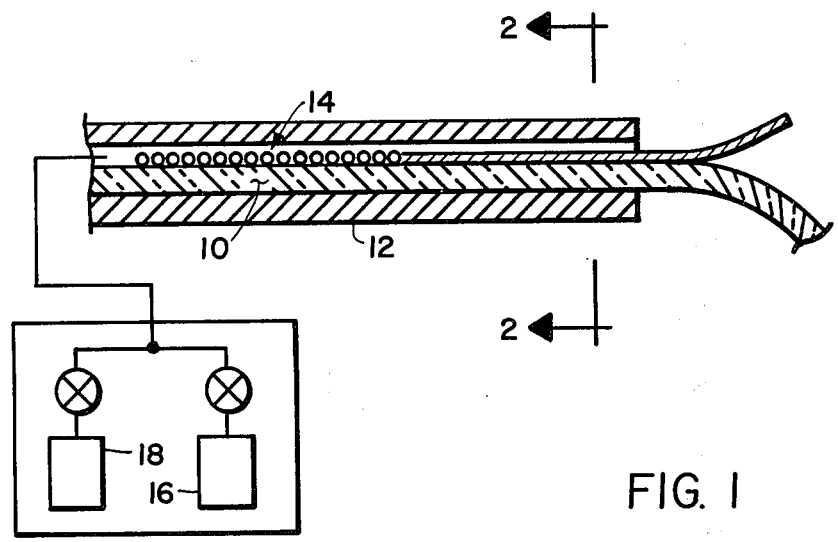
FIG. 1 is a side elevation view partly in section illustrating the process of this invention.
Figure 2:
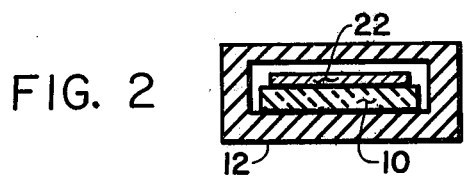
FIG. 2 is an end view taken along lines 2—2 of FIG. 1.

Referring to FIGS. 1 and 2, an endless transparent quartz belt 10 having a width equal to or preferably somewhat greater than the width of the ribbon to be formed is moved through furnace tube 12. Broadcast on the belt is a layer of particulate semiconductor silicon 14 in the form of a strip having the desired width and thickness. Any particulate silicon of solar cell grade can be employed; the particles are generally from 0.5 to 2 mils in diameter. The furnace is purged with an inert gas such as hydrogen 16 and the silicon is heated to a temperature sufficient to cause deposition of silicon from an appropriate gaseous source. The gaseous source indicated as silicon tetrachloride 18 mixes with the hydrogen and passes through the furnace; it passs over and between particles 14. Silicon deposits out of the silicon tetrachloride at temperatures in the range of 1000°–1200° C. Some of the silicon pervades the spaces between silicon particles, depositing within the film and joining the particles together into a continuous ribbon. By the term "ribbon" in the claims and specification herein is meant a self-supporting body which is thin and long compared to its width. The coherent ribbon of polycrystalline silicon 22 is then separated from substrate 10 and directed to a monocrystalline silicon conversion process.

Various modifications of the process described in FIGS. 1 and 2 are contemplated. Thus, the substrate can be metal, such as tungsten, etc., instead of quartz. Any gaseous source of silicon can be used, for example, silane or any of the halosilanes or polyhalosilanes. Preferred are the chlorosilanes such as dichlorosilane, trichlorosilane and siicon tetrachloride.

Figure 3:
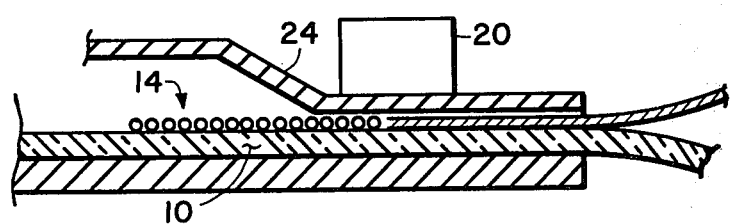
FIG. 3 is a side elevation view partly in section illustrating another embodiment of the method of this invention.

In accordance with a preferred embodiment of the invention as shown in FIG. 3, heating is achieved by moving belt 10 under radiant heater 20. This means of heating serves to heat only the particulate silicon 14, obviating deposition of silicon on any other part of the apparatus. Other heating means to accomplish the same effect would by means of a laser. Furthermore, in FIG. 3 the furnace wall is constricted prior to radiant heater 20, for example at 24. This constriction forces the gaseous silicon source to permeate and come into closer contact with particulate silicon 14. The furnace walls in this embodiment should be transparent at least in the region under heater 20 in order to transmit the radiant energy. The use of a transparent furnace tube also obviates deposition of silicon on the tube walls. Thus, a quartz furnace tube is preferably employed.

It is preferred in the practice of this invention to permit an underlying layer of powdered material to remain on the substrate to serve as a release agent, permitting easier removal of the continuous coherent web from the substrate. This feature is most easily achieved by employing the radiant heater, by means of which the upper layer of silicon is heated more than the underlying region.

The method of this invention provides many advantages. For example, lower temperatures than those required to fuse particulate silicon alone, or to melt silicon, are employed, with a resulting saving in energy. Furhermore, excellent control with respect to web width and thickness is readily achieved.

Although the invention has been described in connection with certain preferred embodiments, it is not intended that the invention be limited thereto. Thus it is intended that the invention cover all alternatives, arrangements, equivalents and embodiments as may be included in the scope of the following claims.

What is claimed is:

1. A method of producing a ribbon of polycrystalline semiconductor material comprising:
    providing a moving surface having disposed thereon a layer of particulate semiconductor silicon;
    providing a gaseous silicon source;
    heating said particulate silicon to a temperature sufficient to deposit silicon.
    contacting said gaseous silicon source with said particulate semiconductor silicon said temperature to deposit silicon from said source onto said silicon, said deposit of silicon joining said particulate semiconductor silicon together thereby forming a continuous, coherent ribbon of semiconductor material.

2. The method of claim 1 wherein said temperature is achieved by heating subsequent to contact of said gaseous silicon source with said silicon.

3. The method of claim 2 wherein said heating is carried out by applying radiant energy to said particulate semiconductor silicon.

4. The method of claim 2 wherein said heating is carried out by applying a laser beam to said particulate semiconductor silicon.

5. The method of claim 3 wherein said moving surface is a transparent substrate.

6. The method of claim 2 wherein said heating is carried out by contacting said gaseous silicon source with said silicon in a furnace tube having transparent walls.

* * * * *